United States Patent
Zarghami et al.

(10) Patent No.: US 9,391,444 B2
(45) Date of Patent: Jul. 12, 2016

(54) METHOD AND COMPONENT FOR VOLTAGE INSTABILITY PROTECTION IN AN ELECTRIC POWER SYSTEM

(71) Applicant: ABB Research Ltd., Zurich (CH)

(72) Inventors: Mahyar Zarghami, Davis, CA (US); Reynaldo Nuqui, Cary, NC (US)

(73) Assignee: ABB RESEARCH LTD., Zurich (SE)

( * ) Notice: Subject to any disclaimer, the term of this patent is extended or adjusted under 35 U.S.C. 154(b) by 677 days.

(21) Appl. No.: 13/713,587

(22) Filed: Dec. 13, 2012

(65) Prior Publication Data

US 2014/0168838 A1 Jun. 19, 2014

(51) Int. Cl.
| | |
|---|---|
| G01R 19/165 | (2006.01) |
| G01R 31/40 | (2014.01) |
| H02H 3/24 | (2006.01) |
| H02J 3/24 | (2006.01) |
| H02J 3/06 | (2006.01) |
| G01R 19/25 | (2006.01) |

(52) U.S. Cl.
CPC .. *H02H 3/24* (2013.01); *H02J 3/06* (2013.01); *H02J 3/24* (2013.01); *G01R 19/2513* (2013.01); *Y02E 60/728* (2013.01); *Y04S 10/265* (2013.01)

(58) Field of Classification Search
None
See application file for complete search history.

(56) References Cited

U.S. PATENT DOCUMENTS

| | | | |
|---|---|---|---|
| 6,219,591 B1 | 4/2001 | Vu et al. | |
| 7,816,927 B2 | 10/2010 | Li et al. | |
| 2005/0077881 A1* | 4/2005 | Capp et al. | 322/29 |
| 2006/0030972 A1 | 2/2006 | Schlueter et al. | |
| 2009/0027067 A1 | 1/2009 | Li et al. | |
| 2009/0085407 A1* | 4/2009 | Venkatasubramanian | 307/98 |
| 2009/0113049 A1* | 4/2009 | Nasle et al. | 709/224 |
| 2009/0299664 A1 | 12/2009 | Zhang et al. | |
| 2010/0039741 A1* | 2/2010 | Booth et al. | 361/63 |
| 2011/0066301 A1* | 3/2011 | Donolo | 700/292 |
| 2013/0154614 A1* | 6/2013 | Gadiraju et al. | 324/103 R |

FOREIGN PATENT DOCUMENTS

| | | |
|---|---|---|
| CA | 2602980 A1 | 1/2009 |
| JP | 2002300722 A | 10/2002 |

OTHER PUBLICATIONS

V. Ajjarapu, et al. "The Continuation Power Flow: A Tool for Steady State Voltage Stability Analysis." Transactions on Power Systems, vol. 7, No. 1. IEEE, Feb. 1992. pp. 416-423.

(Continued)

*Primary Examiner* — Darrin Dunn
*Assistant Examiner* — Md N Mia
(74) *Attorney, Agent, or Firm* — Taft Stettinius & Hollister LLP

(57) ABSTRACT

Voltage instability protection for an electric power system is implemented by determining a change in power injected into a region of interest within the electric power system based on synchronized power measurements from different power injection points of the region of interest, and by determining a change in power absorbed by one or more loads in the region of interest based on synchronized power measurements from different load points of the region of interest. A change in power loss for the region of interest is determined based on the difference between the change in power injected into the region of interest and the change in power absorbed by the region of interest. A voltage instability condition is indicated when the change in power loss for the region of interest approximates the change in power injected into the region of interest.

20 Claims, 7 Drawing Sheets

(56) References Cited

OTHER PUBLICATIONS

Lo, K. L. et al., "Dispatching Outputs of Generators for Enhancing the Power Margins from the Viewpoint of Voltage Stability", IEE 2nd International Conference on Advances in Power System Control, Operation and Management, Dec. 1993, pp. 61-65.

* cited by examiner

METHOD AND COMPONENT FOR VOLTAGE INSTABILITY PROTECTION IN AN ELECTRIC POWER SYSTEM

TECHNICAL FIELD

The instant application relates to electric power systems, and more particularly to voltage instability protection for electric power systems.

BACKGROUND

In the power and energy industry, transmission systems are less expanded compared to distribution systems because of economic and environmental constraints. As a result, system operators tend to use the full capacity of the transmission lines for power transfer. Consequently, congested transmission lines result in problems such as voltage instability. Voltage instability is a phenomenon which results from increasing power flow in power corridors. Once a region faces its maximum power transfer limit, it can no longer satisfy the demand of its connected loads, and voltage collapse occurs with additional power transfer.

Voltage collapse is characterized by an initial slow progressive decline in the voltage magnitude of the power system buses followed by a final rapid decline in the voltage magnitude. The main symptoms of voltage collapse are low voltage profiles, heavy reactive power flows, inadequate reactive support, and heavily loaded systems. The consequences of voltage collapse often require long system restoration, while large groups of customers remain without power for extended periods of time. This phenomenon can become irreversible if the voltages reach their voltage stability limits, meaning that even if the loads are decreased afterwards, such as through load shedding, the system can no longer reestablish its nominal voltages. Conventional approaches provide an index (SDI—S Difference Indicator) for indicating voltage collapse. However, the SDI approach is only based on local measurements on the load side of a power corridor. Since the delivered power to the load becomes less in the proximity to voltage collapse, the SDI approach loses its sensitivity when needed most.

SUMMARY

The embodiments described herein warn against and protect a region of an electric power system from voltage instability including voltage collapse. The power system can be a transmission or distribution system. In each case, the voltage instability warning and protection techniques described herein can be deployed in Intelligent Electronic Devices (IEDs) or similar devices which can send alarm signals to system operators or trip signals to corresponding circuit breakers or other protective devices in the system in order to protect the system against voltage instability, including voltage collapse. In one embodiment, time-synchronized data exchange between IEDs is employed to calculate a metric for voltage instability.

According to an embodiment of a method of protecting an electric power system against voltage instability, the method comprises: determining a change in power injected into a region of interest within the electric power system based on synchronized power measurements from different power injection points of the region of interest; determining a change in power absorbed by one or more loads in the region of interest based on synchronized power measurements from different load points of the region of interest; determining a change in power loss for the region of interest based on the difference between the change in power injected into the region of interest and the change in power absorbed by the region of interest; and indicating a voltage instability condition when the change in power loss for the region of interest approximates the change in power injected into the region of interest.

According to an embodiment of a component of an electric power system, the component comprises a controller and a transmitter. The controller is operable to determine a change in power injected into a region of interest within the electric power system based on synchronized power measurements from different power injection points of the region of interest, and to determine a change in power absorbed by one or more loads in the region of interest based on synchronized power measurements from different load points of the region of interest. The controller is further operable to determine a change in power loss for the region of interest based on the difference between the change in power injected into the region of interest and the change in power absorbed by the region of interest. The transmitter is operable to indicate a voltage instability condition when the change in power loss for the region of interest approximates the change in power injected into the region of interest. The component can be an intelligent electronic device at one of the power injection or load points.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The voltage instability warning and protection embodiments described herein are based on the fact that changes in power injected ($\Delta S_{GEN}$) into a region of interest can be divided into two major components: the changes in power losses ($\Delta S_{LOSS}$) of the region and the changes in the power absorbed ($\Delta S_{LOAD}$) by the loads of the region. This is a direct result of the law of conservation of energy. At the point of voltage collapse, the maximum power transfer point is obtained, and any further increase in power generation approximates a loss.

A further interpretation of the above relationship comes from the mathematical statement of the power flow solution, which has the following format:

$$\Delta S = [J][\Delta x], \quad \begin{bmatrix} \Delta P \\ \Delta Q \end{bmatrix} = \begin{bmatrix} \delta P/\delta\theta & \delta P/\delta V \\ \delta Q/\delta\theta & \delta Q/\delta V \end{bmatrix} \begin{bmatrix} \Delta\theta \\ \Delta V \end{bmatrix} \quad (1)$$

The left column shows the mismatch of the powers in buses arising from the difference between the generated (injected) and consumed (absorbed) powers. The right column shows the changes in voltage angles and magnitudes resulting from the mismatch between the generated and consumed powers. Once the balance between the generated and consumed powers cannot be maintained, the Jacobian matrix [J] in equation (1) becomes singular. In these situations, any additional power injected into the region of interest becomes a loss and is not delivered to any load.

In the case of a power corridor, the receiving side of the corridor is connected to a load. When the load demand increases, the current in the corridor also increases, and hence both active and reactive losses increase. This situation results in voltage drop at the receiving side of the corridor. If the load demand increases further, all additional power sent through the corridor will be consumed as a loss inside the corridor and will not be transferred to the load. The voltage instability warning and protection embodiments described herein protect against such voltage collapse in electric power systems.

Figure 1:
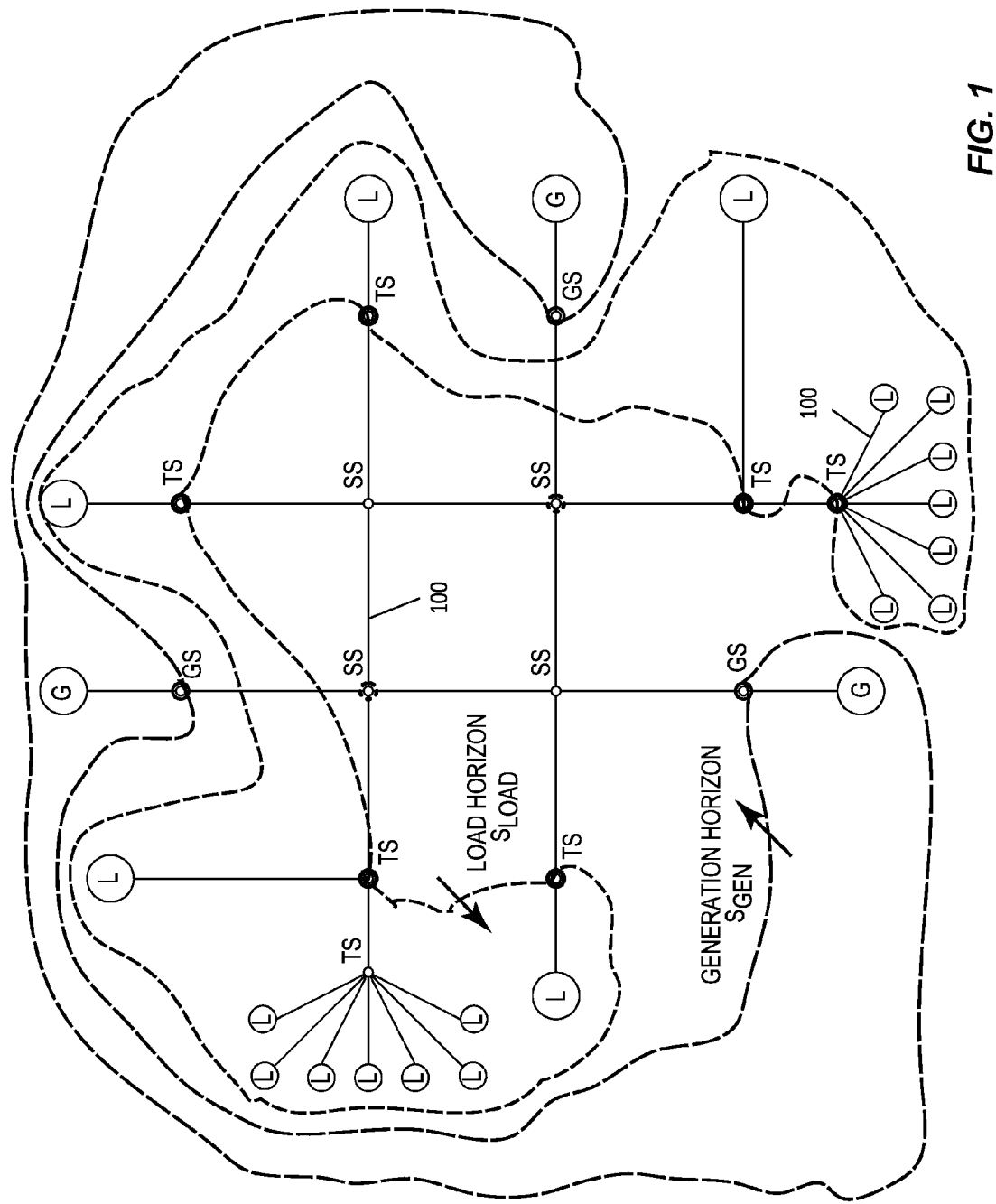
FIG. 1 illustrates a schematic diagram of an electric power system with voltage instability protection.

FIG. 1 illustrates a non-limiting exemplary embodiment of a region of interest within an electric power system such as a transmission and/or distribution system. The power system can have switching substations (SS), transformer substations (TS), generator substations (GS), loads (L), generators (G) and buses or lines 100 for carrying power. Voltage instability such as a voltage collapse can occur within the power system and rapidly propagate to other regions of the system if unmitigated. The embodiments described herein warn of impending voltage instability for a region of interest within the electric power system so that the system operator is notified, and can automatically protect against imminent voltage collapse when conditions warrant such action.

In FIG. 1, a 'load horizon $S_{LOAD}$' is shown encompassing the different load points for the region of interest and a 'generation horizon $S_{GEN}$' is shown encompassing the different power injection points for the region of interest. The region of interest has various measuring points for measuring the power injected into the region of interest (i.e., 'generated' power, abbreviated as $S_{GEN}$) and the power absorbed by the loads in the region of interest (i.e., 'load' power, abbreviated as $S_{LOAD}$). For example, there are three measuring points at the generator substations and six measuring points at the transformer substations in FIG. 1. Power measurements at these different points are synchronized, e.g. by time-aligning the measurements, and used to warn and protect against voltage instability.

Figure 2:
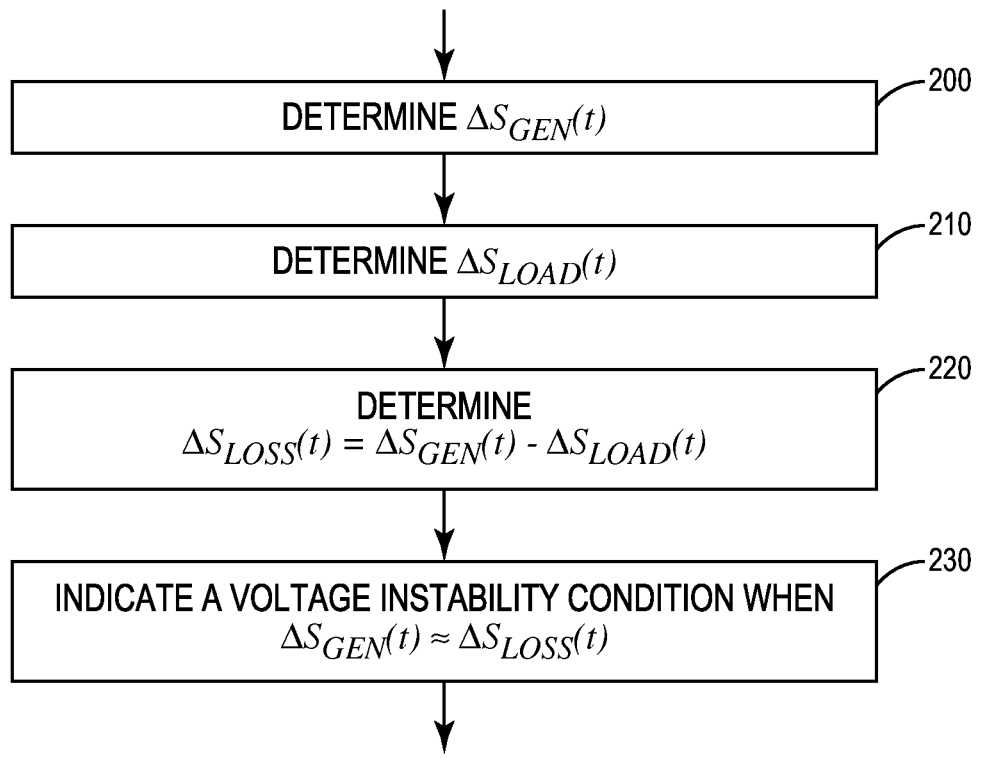
FIG. 2 illustrates a flow diagram of an embodiment of a method of voltage instability protection for an electric power system.

FIG. 2 illustrates a flow diagram of an embodiment of protecting an electric power system against voltage instability. In block 200, the change in power $\Delta S_{GEN}(t)$ injected into a region of interest within the electric power system is determined based on synchronized power measurements from different power injection points of the region of interest as given by:

$$\Delta S_{GEN}(t) = \sum_i S_{gen_i}(t) - S_{gen_i}(t-\tau) \quad (2)$$

where $S_{gen_i}(t)$ is the complex power measured at the $i^{th}$ injection point during the present period, $S_{gen_i}(t-\tau)$ is the complex power measured at the $i^{th}$ injection point during the previous period, and τ corresponds to the time step or period. In general, the power injection points can be border points along the boundary of the region of interest such as the generator substations (GS) shown in FIG. 1 and/or power generators located within the region of interest.

In block 210, the change in power $\Delta S_{LOAD}(t)$ absorbed by one or more loads in the region of interest is determined based on synchronized power measurements from different load points of the region of interest as given by:

$$\Delta S_{LOAD}(t) = \sum_i S_{load_i}(t) - S_{load_i}(t-\tau) \quad (3)$$

where $S_{load_i}(t)$ is the complex power measured at the $i^{th}$ load point during the present period, $S_{load_i}(t-\tau)$ is the complex power measured at the $i^{th}$ load point during the previous period, and τ corresponds to the time step or period. In general, the load points can be any point along the boundary of the region of interest or inside the region of interest where power absorption (consumption) can be measured, such as at the transformer substations (TS) shown in FIG. 1.

In block 220, the change in power loss $\Delta S_{LOSS}(t)$ for the region of interest is determined based on the difference between $\Delta S_{GEN}(t)$ and $\Delta S_{LOAD}(t)$ as given by:

$$\Delta S_{LOSS}(t) = \Delta S_{GEN}(t) - \Delta S_{LOAD}(t) \quad (4)$$

where $\Delta S_{GEN}$, $\Delta S_{LOAD}$ and $\Delta S_{LOSS}$ are the changes in the total complex power provided (injected) to, consumed (absorbed) by and lost by the region of interest and are all complex quantities.

In block 230, a voltage instability condition is indicated when $\Delta S_{LOSS}(t)$ for the region of interest approximates $\Delta S_{GEN}(t)$ as given by:

$$\Delta S_{GEN}(t) \approx \Delta S_{LOSS}(t) \quad (5)$$

A loss index (LI) is described later herein as one embodiment for determining when $\Delta S_{LOSS}(t)$ approximates $\Delta S_{GEN}(t)$.

Figure 3:
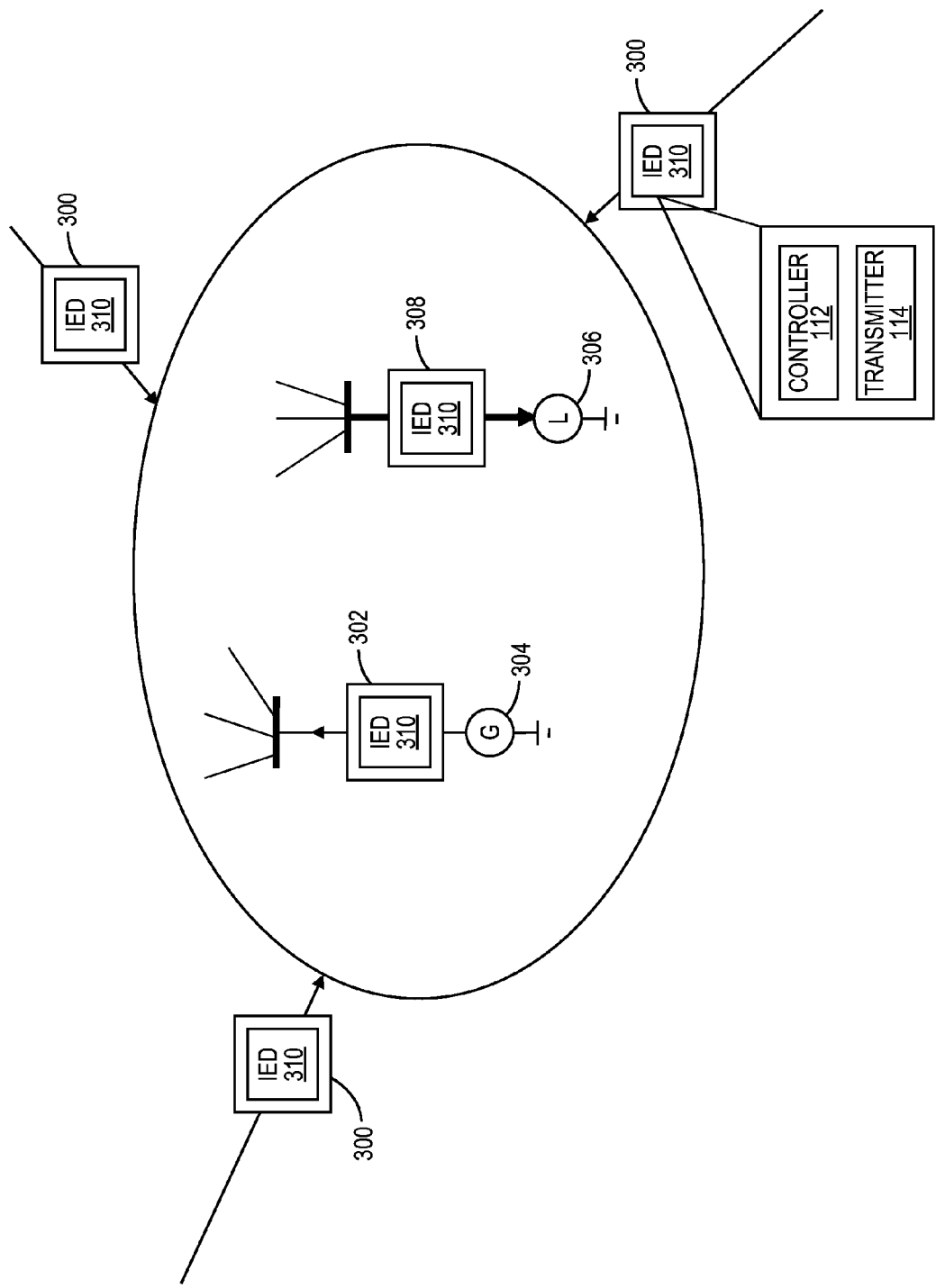
FIG. 3 illustrates a schematic diagram of a region of interest within an electric power system that includes intelligent electronic devices used to implement voltage instability protection.

FIG. 3 illustrates an embodiment of a region of interest within an electric power system for which voltage instability protection is provided according to the method of FIG. 2. Complex power is measured for the region of interest at various points. Some of the points are border points 300 along the boundary of the region of interest, which is indicated by a solid oval in FIG. 3. Power is injected into the region of interest at these border points 300, and therefore the change in power $\Delta S_{GEN}(t)$ injected into the region of interest is at least partly determined in accordance with equation (2) using synchronized power measurements reported by the border points 300. Each border 300 point corresponds to a particular component of the electric power system, e.g. a switching substation (SS), transformer substation (TS), generator substation (GS), load (L), or generator (G) connected at the boundary of the region of interest. The electric power system has one or more dominant lines which deliver the majority of the injected power to the region of interest. In some embodiments, only the border points 300 connected to the dominant lines are monitored to aid in determining the change in power injected into the region of interest. In other embodiments, all border points 300 are monitored. The change in power $\Delta S_{GEN}(t)$ injected into the region of interest is further calculated based on synchronized power measurements reported by injection points 302 connected to power generators 304 located within the region of interest.

The change in power $\Delta S_{LOAD}(t)$ absorbed by one or more loads 306 in the region of interest is determined based on synchronized power measurements from different load points 308 of the region of interest as given by equation (3). These load points 308 can be located inside the region of interest as shown in FIG. 3, but can also be border points which absorb power instead of injecting power.

In one embodiment, each power injection point 300, 302 and each load point 308 has an intelligent electronic device (IED) 310 for measuring power. The synchronized power measurements used to determine $\Delta S_{GEN}(t)$ and $\Delta S_{LOAD}(t)$ are calculated by the different IEDs 310. Communication between the IEDs 310 can be considered as either master-slave or master-master, depending on the architecture. As such, one of the IEDs 310 can perform the calculations as given by equations (2-4) and determine whether a voltage instability condition exists as given by equation (5) based on synchronized power measurements received from the other IEDs 310. This IED 310 decides about the proximity of the region to the voltage collapse based on the received synchronized measurements from all IEDs 310.

Each $i^{th}$ IED 310 in the region of interest calculates a complex power quantity Si, which can be due to load, generation or power through the interface or boundary. Power flowing into the region of interest from a border IED 310 is considered injected power ($S_{GEN}$) and power flowing out of the region of interest from a border IED 310 is considered load power ($S_{LOAD}$). The master IED 310 collects the complex power measurements from the other IEDs 310, and aligns the measurements to ensure time synchronization. Alternatively, each IED 310 can be a master. According to this embodiment, the IEDs 310 receive power measurements from each other and independently calculate the voltage instability metric in accordance with equations (2-5).

The master IED 310 (for a master-slave configuration) or each IED 310 (for a master-master configuration) has a controller 112 for determining $\Delta S_{GEN}(t)$, $\Delta S_{LOAD}(t)$ and $\Delta S_{LOSS}(t)$ in accordance with equations (2-4), and determining whether voltage instability is likely for the region of interest in accordance with equation (5). The master IED 310 (for a master-slave configuration) or each IED 310 (for a master-master configuration) also has a transmitter 114 for indicating a voltage instability condition to the system operator when $\Delta S_{LOSS}(t)$ approximates $\Delta S_{GEN}(t)$ so that the system operator can take corrective action if desired. The transmitter 114 can also send a voltage instability condition to circuit breakers to effect load shedding if desired.

Synchronization can be achieved in several ways. If the IEDs 310 are phasor measurement units, the master IED 310 can collect and align time-tagged complex power measurements from the other IEDs 310. In this case, the time tags can be generated from a common timing source such as a GPS system. Alternatively, time-aligning can be done using the ECHO method.

To quantify the closeness to voltage collapse, the following loss index (LI) is defined:

$$LI = \frac{|\Delta S_{GEN} - \Delta S_{LOSS}|}{\max(|\Delta S_{GEN}|, |\Delta S_{LOSS}|)} \qquad (6)$$

where LI is a real number between 0 and 2. The extreme cases for LI are: (a) LI=2 when the two vectors are equal in magnitude but opposite in phase; and (b) LI=0 when the two vectors are equal both in magnitude and phase. Proximity of LI to zero can be considered a sign of voltage collapse. That is, voltage collapse within the region of interest becomes more likely the closer LI is to zero.

When the loss index LI violates an alarm threshold (AT), e.g. by becoming smaller than AT when LI is calculated in accordance with equation (6), the master IED 310 (for a master-slave configuration) or another IED 310 (for a master-master configuration) sets an alarm to notify the system operator of the emergency condition. The protection scheme may consider another threshold level as a trip threshold (TT), upon which the master IED 310 or another IED 310 forces one or more protective devices of the electric power system to open into a protective state so that the region of interest is isolated from other regions of the system to relieve the loading in the region of interest.

Figure 4:
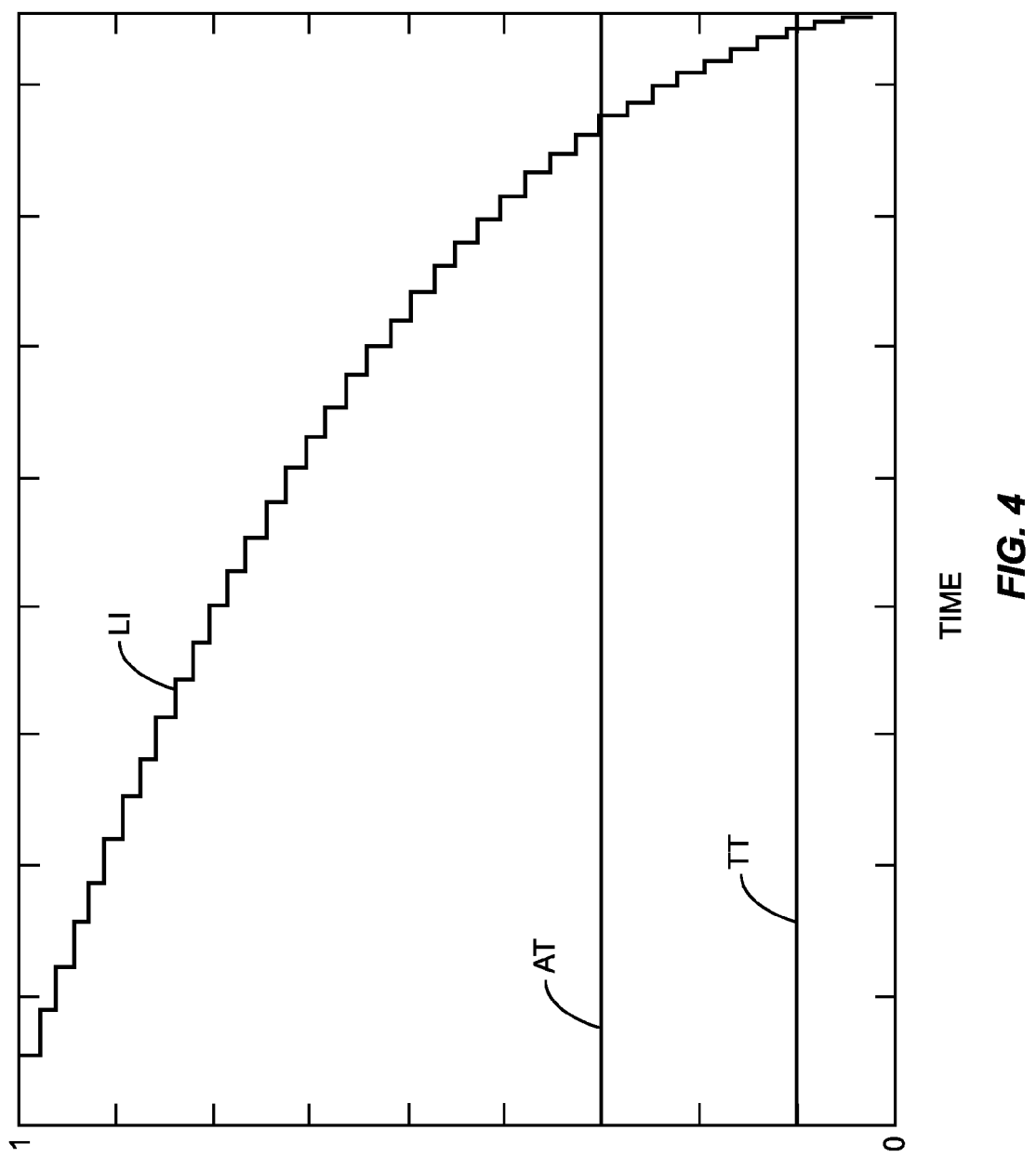
FIG. 4 is a plot diagram illustrating an alarm threshold and a trip threshold applied to a loss index (LI) designed to indicate voltage instability.

FIG. 4 shows an implementation of LI where the alarm threshold AT is set differently than the trip threshold TT. The alarm threshold AT should be set higher than the trip threshold TT when the loss index LI is calculated in accordance with equation (6), because voltage collapse becomes more likely the closer LI is to zero in this embodiment. This way, the system operator can be notified before the instability degrades to the point of imminent voltage collapse. At that point, protective devices such as circuit breakers are forced into a protective state by one or more of the IEDs 310 to prevent the voltage collapse from spreading further throughout the electric power system. Settings for AT and TT are system-dependent and can be adjusted as appropriate.

As is seen from equation (6), when the changes in the region of interest are negligible, both $\Delta S_{GEN}$ and $\Delta S_{LOSS}$ are small and computation of the loss index LI can result in unpredictable numbers. Updates to the loss index LI can be controlled so that small changes in $\Delta S_{GEN}$ and $\Delta S_{LOSS}$ do not result in unpredictability of LI.

Figure 5:
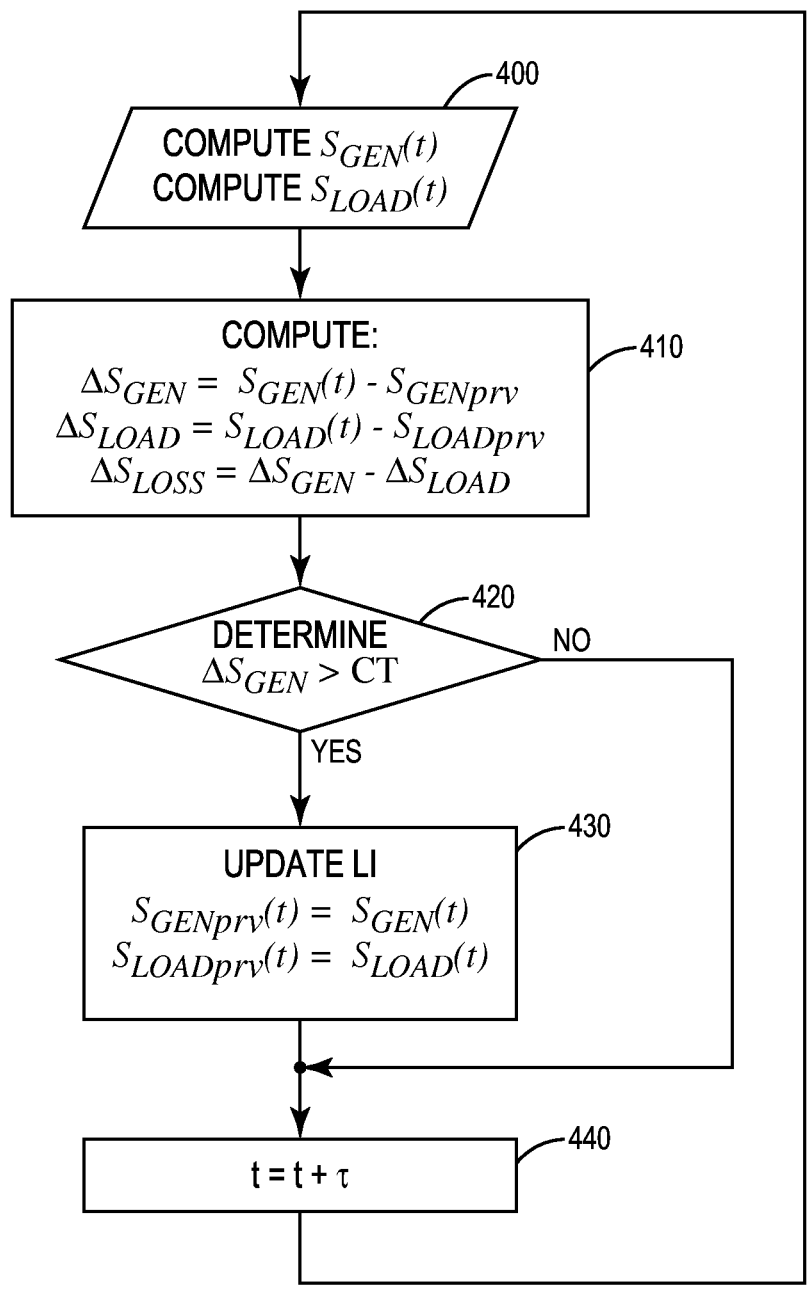
FIG. 5 illustrates a flow diagram of an embodiment of a method of updating the loss index.

FIG. 5 illustrates an embodiment of a voltage instability protection method where unpredictability in the loss index LI is avoided. According to this embodiment, the power $S_{GEN}(t)$ injected into the region of interest within the electric power system and the power $S_{LOAD}(t)$ absorbed by one or more loads in the region of interest are computed (Block 400). $\Delta S_{GEN}$, $\Delta S_{LOAD}$ and $\Delta S_{LOSS}$ are then computed (Block 410), e.g. in accordance with equations (2-4). If $\Delta S_{GEN}$ is greater than a change threshold CT (Block 420), the loss index LI is updated in accordance with equation (6) based on the present values of $S_{GEN}(t)$ and $S_{LOAD}(t)$, and $S_{GEN}(t)$ and $S_{LOAD}(t)$ for the current period are set as the same values for the previous period as $S_{GENprev}(t)=S_{GEN}(t)$ and $S_{LOADprev}(t)=S_{LOAD}(t)$ (Block 430). Otherwise, that time period is skipped (Block 440). This way, the computations of $\Delta S_{GEN}$, $\Delta S_{LOAD}$ and $\Delta S_{LOSS}$ take place only when $\Delta S_{GEN}$ is greater than the change threshold CT. Otherwise, the master IED 310 or other IED 310 waits until enough change occurs in $\Delta S_{GEN}$ before recalculating the loss index LI. A typical change threshold CT depends on the electric power system and the load growth rate of the system.

Figure 6:
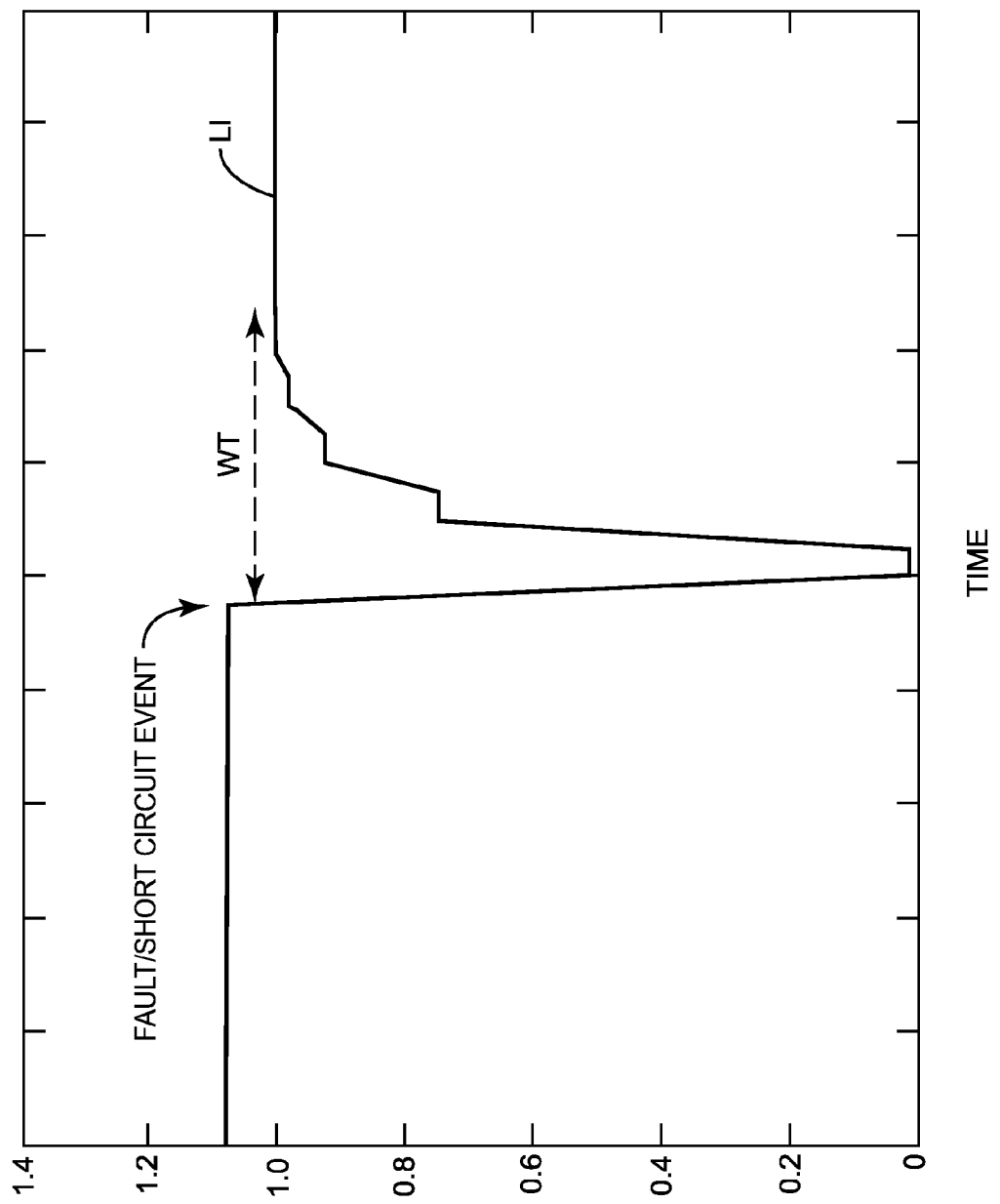
FIG. 6 is a plot diagram illustrating a wait time period applied to the loss index LI.

For additional protection, a wait time (WT) parameter can also be implemented as shown in FIG. 6. The wait time WT is the time duration which must lapse before a trip order is triggered. This is especially useful when a fault or short circuit event happens in the system which alters the value of the loss index LI. If the loss index LI is less than the trip threshold TT but goes back into its safe region before the wait time WT expires, protective devices are not forcefully tripped.

Figure 7:
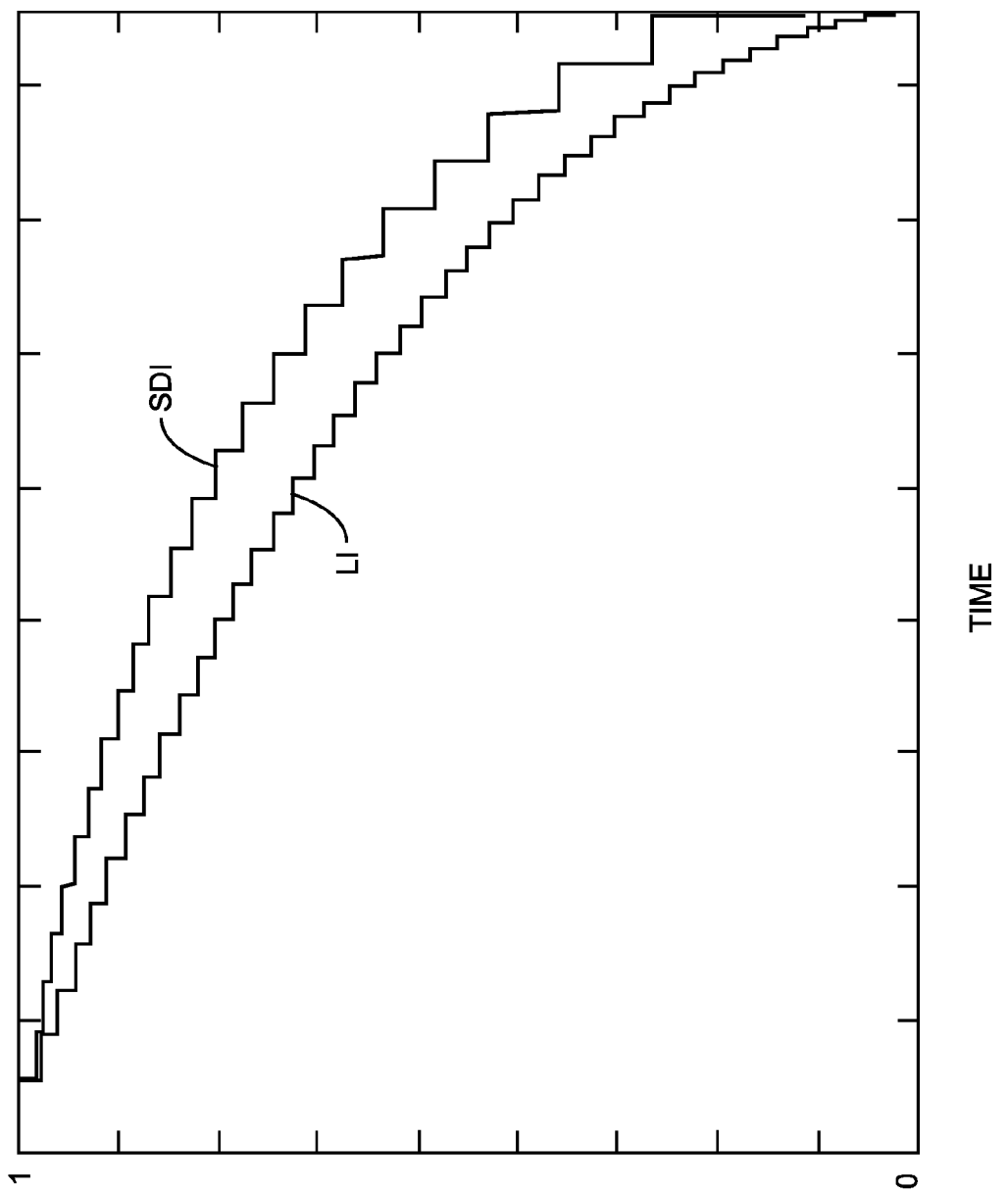
FIG. 7 is a plot diagram comparing the LI-based voltage instability technique to a conventional SDI (S Difference Indicator) approach.

FIG. 7 illustrates a plot diagram of the loss index (LI) based voltage instability protection scheme described herein as compared to the conventional SDI approach, which is only based on local measurements on the load side of a power corridor. Both plots are based on simulations in the same power corridor with the same sensitivity setting. The LI-based voltage instability protection scheme described herein can be generalized to any region of interest in any electric power system, provided that synchronized measurements are available. Moreover, the loss index LI is more sensitive compared to the conventional SDI, since the updated index values in the loss index LI approach are based on the changes of power on the generation and load side while the updated index values in the SDI method are based on the changes of power only on the load side. Since the delivered power to the load becomes less in the proximity to voltage collapse, the SDI approach loses its sensitivity when needed most. FIG. 7 shows this distinction—as the load grows (i.e., the indexes approach zero), more updates occur under the loss index LI approach while less updates occur under the SDI approach.

The voltage stability protection embodiments described herein provide suitable criteria for voltage stability protection based on wide area information received from measurements in a region of interest. Both local and remote measurements can be considered to improve accuracy. A coordinated action of protection devices during times of system disturbances is provided. The voltage stability protection embodiments described herein do not depend on complex mathematical formulation of system components which in turn depends on system models which can be inaccurate and change over time. Further, the embodiments arrest the spread of voltage collapse and prevent propagation of voltage instability.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of protecting an electric power system against voltage instability, the method comprising:
    determining a change in power injected into a region of interest within the electric power system based on synchronized power measurements from different power injection points of the region of interest;
    determining a change in power absorbed by one or more loads in the region of interest based on synchronized power measurements from different load points of the region of interest;
    determining a change in power loss for the region of interest based on the difference between the change in power injected into the region of interest and the change in power absorbed by the region of interest;
    indicating a voltage instability condition when the change in power loss for the region of interest approximates the change in power injected into the region of interest; and
    controlling one or more protective devices based on determining the voltage instability.

2. The method according to claim 1, wherein the power injection points comprise at least one of border points at a boundary of the region of interest and power generators located within the region of interest.

3. The method according to claim 2, wherein the electric power system has one or more dominant lines which deliver the majority of the injected power to the region of interest, and wherein only the border points connected to the dominant lines are monitored to determine the change in power injected into the region of interest.

4. The method according to claim 1, wherein each power injection point and each load point has an intelligent electronic device for measuring power, and wherein the synchronized power measurements are obtained from the intelligent electronic devices.

5. The method according to claim 1, wherein the change in power loss for the region of interest, the change in power injected into the region of interest, and the change in power absorbed by the region of interest are calculated for a present evaluation period when the power injected into the region of interest changes by more than a predetermined amount from an immediately preceding evaluation period to the present evaluation period.

6. The method according to claim 1, wherein indicating a voltage instability condition comprises:
    calculating a loss index as a function of the change in power loss for the region of interest and the change in power injected into the region of interest; and
    setting an alarm when the loss index violates an alarm threshold.

7. The method according to claim 6, wherein the loss index is a real number between zero and two, and wherein a voltage collapse within the region of interest is more likely the closer the loss index is to zero.

8. The method according to claim 6, further comprising forcing one or more protective devices in the electric power system to open into a protective state so that the region of interest is isolated from the remainder of the electric power system when the loss index violates a trip threshold which is different than the alarm threshold.

9. The method according to claim 8, wherein the one or more protective devices are forced to open into the protective state if the loss index violates the trip threshold for a predetermined time period.

10. The method according to claim 6, wherein calculation of the loss index for a present evaluation period is skipped if the power injected into the region of interest changes by less than a predetermined amount from an immediately preceding evaluation period to the current evaluation period.

11. A component of an electric power system, comprising:
    a controller operable to:
    determine a change in power injected into a region of interest within the electric power system based on synchronized power measurements from different power injection points of the region of interest;

determine a change in power absorbed by one or more loads in the region of interest based on synchronized power measurements from different load points of the region of interest; and determine a change in power loss for the region of interest based on the difference between the change in power injected into the region of interest and the change in power absorbed by the region of interest; and a transmitter operable to indicate a voltage instability condition when the change in power loss for the region of interest approximates the change in power injected into the region of interest;

wherein the controller controls one or more protective devices based on determining the voltage instability.

12. The component according to claim 11, wherein the component comprises an intelligent electronic device including the controller and the transmitter, and wherein the intelligent electronic device is operable to measure power at one of the power injection points or the load points.

13. The component according to claim 12, wherein the intelligent electronic device is included in a border point at a boundary of the region of interest or a power generator located within the region of interest.

14. The component according to claim 11, wherein each power injection point and each load point has an intelligent electronic device for measuring power, wherein the synchronized power measurements are obtained from the intelligent electronic devices, and wherein the component is one of the intelligent electronic devices.

15. The component according to claim 11, wherein the controller is operable to calculate the change in power loss for the region of interest, the change in power injected into the region of interest, and the change in power absorbed by the region of interest for a present evaluation period when the power injected into the region of interest changes by more than a predetermined amount from an immediately preceding evaluation period to the present evaluation period.

16. The component according to claim 11, wherein the controller is operable to calculate a loss index as a function of the change in power loss for the region of interest and the change in power injected into the region of interest, and set an alarm indicating a voltage instability condition when the loss index violates an alarm threshold.

17. The component according to claim 16, wherein the loss index is a real number between zero and two, and wherein a voltage collapse within the region of interest is more likely the closer the loss index is to zero.

18. The component according to claim 16, wherein the controller is operable to force one or more protective devices in the electric power system to open into a protective state so that the region of interest is isolated from the remainder of the electric power system when the loss index violates a trip threshold which is different than the alarm threshold.

19. The component according to claim 18, wherein the controller is operable to force the one or more protective devices to open into the protective state if the loss index violates the trip threshold for a predetermined time period.

20. The component according to claim 16, wherein the controller is operable to skip the calculation of the loss index for a present evaluation period if the power injected into the region of interest changes by less than a predetermined amount from an immediately preceding evaluation period to the current evaluation period.

* * * * *